(12) United States Patent
Salter et al.

(10) Patent No.: US 9,136,840 B2
(45) Date of Patent: Sep. 15, 2015

(54) PROXIMITY SWITCH ASSEMBLY HAVING DYNAMIC TUNED THRESHOLD

(75) Inventors: Stuart C. Salter, White Lake, MI (US); Cornel Lewis Gardner, Romulus, MI (US); Pietro Buttolo, Dearborn Heights, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 765 days.

(21) Appl. No.: 13/473,815

(22) Filed: May 17, 2012

(65) Prior Publication Data

US 2013/0307610 A1 Nov. 21, 2013

(51) Int. Cl.
*H03K 17/945* (2006.01)
*H03K 17/955* (2006.01)

(52) U.S. Cl.
CPC ............ *H03K 17/945* (2013.01); *H03K 17/955* (2013.01); *H03K 2217/94026* (2013.01)

(58) Field of Classification Search
CPC ............. H03K 17/945; H03K 17/955; H03K 2217/945
USPC .......................................................... 307/116
See application file for complete search history.

(56) References Cited

U.S. PATENT DOCUMENTS

| | | | |
|---|---|---|---|
| 3,382,588 A | 5/1968 | Serrell et al. | |
| 3,544,804 A | 12/1970 | Gaumer et al. | |
| 3,691,396 A | 9/1972 | Hinrichs | |
| 3,707,671 A | 12/1972 | Morrow et al. | |
| 3,725,589 A * | 4/1973 | Golden ........................... | 379/75 |
| 3,826,979 A | 7/1974 | Steinmann | |
| 4,204,204 A | 5/1980 | Pitstick | |
| 4,205,325 A | 5/1980 | Haygood et al. | |
| 4,232,289 A | 11/1980 | Daniel | |
| 4,257,117 A | 3/1981 | Besson | |
| 4,290,052 A | 9/1981 | Eichelberger et al. | |
| 4,340,813 A | 7/1982 | Sauer | |
| 4,374,381 A | 2/1983 | Ng et al. | |
| 4,377,049 A | 3/1983 | Simon et al. | |
| 4,380,040 A | 4/1983 | Posset | |
| 4,413,252 A | 11/1983 | Tyler et al. | |

(Continued)

FOREIGN PATENT DOCUMENTS

| | | |
|---|---|---|
| DE | 4024052 | 1/1992 |
| EP | 1152443 | 11/2001 |

(Continued)

OTHER PUBLICATIONS

U.S. Appl. No. 14/518,141, filed Oct. 20, 2014, entitled "Directional Proximity Switch Assemby," (23 pages of specification and 13 pages of drawings) and Official Filing Receipt (3 pages).

(Continued)

*Primary Examiner* — Jared Fureman
*Assistant Examiner* — Emmanuel R Dominique
(74) *Attorney, Agent, or Firm* — Vichit Chea; Price Heneveld LLP

(57) ABSTRACT

A method of activating a proximity switch is provided. The method of activating the proximity switch includes the step of sensing a signal associated with a proximity sensor and sensing a dynamic parameter. The method also includes the step of tuning a threshold value based on the sensed dynamic parameter. The method further includes the step of activating the switch based on the signal and the threshold value.

20 Claims, 8 Drawing Sheets

(56) References Cited

U.S. PATENT DOCUMENTS

| | | | |
|---|---|---|---|
| 4,431,882 A | 2/1984 | Frame | |
| 4,446,380 A | 5/1984 | Moriya et al. | |
| 4,453,112 A | 6/1984 | Sauer et al. | |
| 4,492,958 A | 1/1985 | Minami | |
| 4,494,105 A | 1/1985 | House | |
| 4,502,726 A | 3/1985 | Adams | |
| 4,514,817 A | 4/1985 | Pepper et al. | |
| 4,613,802 A | 9/1986 | Kraus et al. | |
| 4,680,429 A | 7/1987 | Murdock et al. | |
| 4,743,895 A | 5/1988 | Alexander | |
| 4,748,390 A | 5/1988 | Okushima et al. | |
| 4,758,735 A | 7/1988 | Ingraham | |
| 4,821,029 A | 4/1989 | Logan et al. | |
| 4,855,550 A | 8/1989 | Schultz, Jr. | |
| 4,872,485 A | 10/1989 | Laverty, Jr. | |
| 4,899,138 A | 2/1990 | Araki et al. | |
| 4,901,074 A | 2/1990 | Sinn et al. | |
| 4,905,001 A | 2/1990 | Penner | |
| 4,924,222 A | 5/1990 | Antikidis et al. | |
| 4,972,070 A | 11/1990 | Laverty, Jr. | |
| 5,025,516 A | 6/1991 | Wilson | |
| 5,033,508 A | 7/1991 | Laverty, Jr. | |
| 5,036,321 A | 7/1991 | Leach et al. | |
| 5,050,634 A | 9/1991 | Fiechtner | |
| 5,063,306 A | 11/1991 | Edwards | |
| 5,108,530 A | 4/1992 | Niebling, Jr. et al. | |
| 5,153,590 A | 10/1992 | Charlier | |
| 5,159,159 A | 10/1992 | Asher | |
| 5,159,276 A | 10/1992 | Reddy, III | |
| 5,177,341 A | 1/1993 | Balderson | |
| 5,212,621 A | 5/1993 | Panter | |
| 5,215,811 A | 6/1993 | Reafler et al. | |
| 5,239,152 A | 8/1993 | Caldwell et al. | |
| 5,270,710 A | 12/1993 | Gaultier et al. | |
| 5,294,889 A | 3/1994 | Heep et al. | |
| 5,329,239 A | 7/1994 | Kindermann et al. | |
| 5,341,231 A | 8/1994 | Yamamoto et al. | |
| 5,403,980 A | 4/1995 | Eckrich | |
| 5,451,724 A | 9/1995 | Nakazawa et al. | |
| 5,467,080 A | 11/1995 | Stoll et al. | |
| 5,477,422 A | 12/1995 | Hooker et al. | |
| 5,494,180 A | 2/1996 | Callahan | |
| 5,512,836 A | 4/1996 | Chen et al. | |
| 5,548,268 A | 8/1996 | Collins | |
| 5,566,702 A | 10/1996 | Philipp | |
| 5,572,205 A | 11/1996 | Caldwell et al. | |
| 5,586,042 A | 12/1996 | Pisau et al. | |
| 5,594,222 A | 1/1997 | Caldwell | |
| 5,598,527 A | 1/1997 | Debrus et al. | |
| 5,670,886 A | 9/1997 | Wolff et al. | |
| 5,681,515 A | 10/1997 | Pratt et al. | |
| 5,730,165 A | 3/1998 | Philipp | |
| 5,747,756 A | 5/1998 | Boedecker | |
| 5,760,554 A | 6/1998 | Bustamante | |
| 5,790,107 A | 8/1998 | Kasser et al. | |
| 5,796,183 A | 8/1998 | Hourmand | |
| 5,825,352 A | 10/1998 | Bisset et al. | |
| 5,827,980 A | 10/1998 | Doemens et al. | |
| 5,864,105 A | 1/1999 | Andrews | |
| 5,867,111 A | 2/1999 | Caldwell et al. | |
| 5,874,672 A | 2/1999 | Gerardi et al. | |
| 5,917,165 A | 6/1999 | Platt et al. | |
| 5,920,309 A | 7/1999 | Bisset et al. | |
| 5,942,733 A | 8/1999 | Allen et al. | |
| 5,963,000 A | 10/1999 | Tsutsumi et al. | |
| 5,973,417 A | 10/1999 | Goetz et al. | |
| 5,973,623 A | 10/1999 | Gupta et al. | |
| 6,010,742 A | 1/2000 | Tanabe et al. | |
| 6,011,602 A | 1/2000 | Miyashita et al. | |
| 6,031,465 A | 2/2000 | Burgess | |
| 6,035,180 A | 3/2000 | Kubes et al. | |
| 6,037,930 A | 3/2000 | Wolfe et al. | |
| 6,040,534 A | 3/2000 | Beukema | |
| 6,157,372 A | 12/2000 | Blackburn et al. | |
| 6,172,666 B1 | 1/2001 | Okura | |
| 6,215,476 B1 | 4/2001 | Depew et al. | |
| 6,219,253 B1 | 4/2001 | Green | |
| 6,231,111 B1 | 5/2001 | Carter et al. | |
| 6,275,644 B1 | 8/2001 | Domas et al. | |
| 6,288,707 B1 | 9/2001 | Philipp | |
| 6,292,100 B1 | 9/2001 | Dowling | |
| 6,310,611 B1 | 10/2001 | Caldwell | |
| 6,320,282 B1 | 11/2001 | Caldwell | |
| 6,323,919 B1 | 11/2001 | Yang et al. | |
| 6,369,369 B2 | 4/2002 | Kochman et al. | |
| 6,377,009 B1 | 4/2002 | Philipp | |
| 6,379,017 B2 | 4/2002 | Nakabayashi et al. | |
| 6,380,931 B1 | 4/2002 | Gillespie et al. | |
| 6,404,158 B1 * | 6/2002 | Boisvert et al. | 318/469 |
| 6,415,138 B2 | 7/2002 | Sirola et al. | |
| 6,427,540 B1 | 8/2002 | Monroe et al. | |
| 6,452,138 B1 | 9/2002 | Kochman et al. | |
| 6,452,514 B1 | 9/2002 | Philipp | |
| 6,456,027 B1 | 9/2002 | Pruessel | |
| 6,457,355 B1 | 10/2002 | Philipp | |
| 6,464,381 B2 | 10/2002 | Anderson, Jr. et al. | |
| 6,466,036 B1 | 10/2002 | Philipp | |
| 6,485,595 B1 | 11/2002 | Yenni, Jr. et al. | |
| 6,529,125 B1 | 3/2003 | Butler et al. | |
| 6,535,200 B2 | 3/2003 | Philipp | |
| 6,535,694 B2 * | 3/2003 | Engle et al. | 396/263 |
| 6,537,359 B1 | 3/2003 | Spa | |
| 6,538,579 B1 | 3/2003 | Yoshikawa et al. | |
| 6,559,902 B1 | 5/2003 | Kusuda et al. | |
| 6,587,097 B1 | 7/2003 | Aufderheide et al. | |
| 6,603,306 B1 | 8/2003 | Olsson et al. | |
| 6,607,413 B2 | 8/2003 | Stevenson et al. | |
| 6,614,579 B2 | 9/2003 | Roberts et al. | |
| 6,617,975 B1 | 9/2003 | Burgess | |
| 6,639,159 B2 | 10/2003 | Anzai | |
| 6,646,398 B1 | 11/2003 | Fukazawa et al. | |
| 6,652,777 B2 | 11/2003 | Rapp et al. | |
| 6,654,006 B2 | 11/2003 | Kawashima et al. | |
| 6,661,410 B2 | 12/2003 | Casebolt et al. | |
| 6,664,489 B2 | 12/2003 | Kleinhans et al. | |
| 6,713,897 B2 | 3/2004 | Caldwell | |
| 6,734,377 B2 | 5/2004 | Gremm et al. | |
| 6,738,051 B2 | 5/2004 | Boyd et al. | |
| 6,740,416 B1 | 5/2004 | Yokogawa et al. | |
| 6,756,970 B2 | 6/2004 | Keely, Jr. et al. | |
| 6,773,129 B2 | 8/2004 | Anderson, Jr. et al. | |
| 6,774,505 B1 | 8/2004 | Wnuk | |
| 6,794,728 B1 | 9/2004 | Kithil | |
| 6,795,226 B2 | 9/2004 | Agrawal et al. | |
| 6,809,280 B2 | 10/2004 | Divigalpitiya et al. | |
| 6,812,424 B2 | 11/2004 | Miyako | |
| 6,819,316 B2 | 11/2004 | Schulz et al. | |
| 6,819,990 B2 | 11/2004 | Ichinose | |
| 6,825,752 B2 | 11/2004 | Nahata et al. | |
| 6,834,373 B2 | 12/2004 | Dieberger | |
| 6,841,748 B2 | 1/2005 | Serizawa et al. | |
| 6,847,018 B2 | 1/2005 | Wong | |
| 6,847,289 B2 | 1/2005 | Pang et al. | |
| 6,854,870 B2 | 2/2005 | Huizenga | |
| 6,879,250 B2 | 4/2005 | Fayt et al. | |
| 6,884,936 B2 | 4/2005 | Takahashi et al. | |
| 6,891,114 B2 | 5/2005 | Peterson | |
| 6,891,530 B2 | 5/2005 | Umemoto et al. | |
| 6,897,390 B2 | 5/2005 | Caldwell et al. | |
| 6,929,900 B2 | 8/2005 | Farquhar et al. | |
| 6,930,672 B1 | 8/2005 | Kuribayashi | |
| 6,940,291 B1 | 9/2005 | Ozick | |
| 6,960,735 B2 | 11/2005 | Hein et al. | |
| 6,962,436 B1 | 11/2005 | Holloway et al. | |
| 6,964,023 B2 | 11/2005 | Maes et al. | |
| 6,966,225 B1 | 11/2005 | Mallary | |
| 6,967,587 B2 | 11/2005 | Snell et al. | |
| 6,977,615 B2 | 12/2005 | Brandwein, Jr. | |
| 6,987,605 B2 | 1/2006 | Liang et al. | |
| 6,993,607 B2 | 1/2006 | Philipp | |
| 6,999,066 B2 | 2/2006 | Litwiller | |
| 7,030,513 B2 | 4/2006 | Caldwell | |
| 7,046,129 B2 | 5/2006 | Regnet et al. | |
| 7,053,360 B2 | 5/2006 | Balp et al. | |

(56) References Cited

U.S. PATENT DOCUMENTS

| | | |
|---|---|---|
| 7,063,379 B2 | 6/2006 | Steuer et al. |
| 7,091,836 B2 | 8/2006 | Kachouh et al. |
| 7,091,886 B2 | 8/2006 | DePue et al. |
| 7,098,414 B2 | 8/2006 | Caldwell |
| 7,105,752 B2 | 9/2006 | Tsai et al. |
| 7,106,171 B1 | 9/2006 | Burgess |
| 7,135,995 B2 | 11/2006 | Engelmann et al. |
| 7,146,024 B2 | 12/2006 | Benkley, III |
| 7,151,450 B2 | 12/2006 | Beggs et al. |
| 7,151,532 B2 | 12/2006 | Schulz |
| 7,154,481 B2 | 12/2006 | Cross et al. |
| 7,180,017 B2 | 2/2007 | Hein |
| 7,186,936 B2 | 3/2007 | Marcus et al. |
| 7,205,777 B2 | 4/2007 | Schulz et al. |
| 7,215,529 B2 | 5/2007 | Rosenau |
| 7,218,498 B2 | 5/2007 | Caldwell |
| 7,232,973 B2 | 6/2007 | Kaps et al. |
| 7,242,393 B2 | 7/2007 | Caldwell |
| 7,245,131 B2 | 7/2007 | Kurachi et al. |
| 7,248,151 B2 | 7/2007 | Mc Call |
| 7,248,955 B2 | 7/2007 | Hein et al. |
| 7,254,775 B2 | 8/2007 | Geaghan et al. |
| 7,255,466 B2 * | 8/2007 | Schmidt et al. ............... 362/501 |
| 7,255,622 B2 | 8/2007 | Stevenson et al. |
| 7,269,484 B2 | 9/2007 | Hein |
| 7,295,168 B2 | 11/2007 | Saegusa et al. |
| 7,295,904 B2 | 11/2007 | Kanevsky et al. |
| 7,339,579 B2 | 3/2008 | Richter et al. |
| 7,342,485 B2 | 3/2008 | Joehl et al. |
| 7,347,297 B2 * | 3/2008 | Ide et al. ....................... 180/282 |
| 7,355,595 B2 | 4/2008 | Bathiche et al. |
| 7,361,860 B2 | 4/2008 | Caldwell |
| 7,385,308 B2 | 6/2008 | Yerdon et al. |
| 7,445,350 B2 | 11/2008 | Konet et al. |
| 7,447,575 B2 | 11/2008 | Goldbeck et al. |
| 7,479,788 B2 | 1/2009 | Bolender et al. |
| 7,489,053 B2 | 2/2009 | Gentile et al. |
| 7,521,941 B2 | 4/2009 | Ely et al. |
| 7,521,942 B2 | 4/2009 | Reynolds |
| 7,531,921 B2 | 5/2009 | Cencur |
| 7,532,202 B2 | 5/2009 | Roberts |
| 7,535,131 B1 | 5/2009 | Safieh, Jr. |
| 7,535,459 B2 | 5/2009 | You et al. |
| 7,567,240 B2 | 7/2009 | Peterson, Jr. et al. |
| 7,583,092 B2 | 9/2009 | Reynolds et al. |
| 7,643,010 B2 | 1/2010 | Westerman et al. |
| 7,653,883 B2 | 1/2010 | Hotelling et al. |
| 7,688,080 B2 | 3/2010 | Golovchenko et al. |
| 7,701,440 B2 | 4/2010 | Harley |
| 7,705,257 B2 | 4/2010 | Arione et al. |
| 7,708,120 B2 | 5/2010 | Einbinder |
| 7,710,245 B2 | 5/2010 | Pickering |
| 7,714,846 B1 | 5/2010 | Gray |
| 7,719,142 B2 | 5/2010 | Hein et al. |
| 7,728,819 B2 | 6/2010 | Inokawa |
| 7,737,953 B2 | 6/2010 | Mackey |
| 7,737,956 B2 | 6/2010 | Hsieh et al. |
| 7,777,732 B2 | 8/2010 | Herz et al. |
| 7,782,307 B2 | 8/2010 | Westerman et al. |
| 7,791,594 B2 | 9/2010 | Dunko |
| 7,795,882 B2 | 9/2010 | Kirchner et al. |
| 7,800,590 B2 | 9/2010 | Satoh et al. |
| 7,821,425 B2 | 10/2010 | Philipp |
| 7,834,853 B2 | 11/2010 | Finney et al. |
| 7,839,392 B2 | 11/2010 | Pak et al. |
| 7,876,310 B2 | 1/2011 | Westerman et al. |
| 7,881,940 B2 | 2/2011 | Dusterhoff |
| RE42,199 E | 3/2011 | Caldwell |
| 7,898,531 B2 | 3/2011 | Bowden et al. |
| 7,920,131 B2 | 4/2011 | Westerman |
| 7,924,143 B2 | 4/2011 | Griffin et al. |
| 7,957,864 B2 | 6/2011 | Lenneman et al. |
| 7,977,596 B2 | 7/2011 | Born et al. |
| 7,978,181 B2 | 7/2011 | Westerman |
| 7,989,752 B2 | 8/2011 | Yokozawa |
| 8,026,904 B2 | 9/2011 | Westerman |
| 8,050,876 B2 | 11/2011 | Feen et al. |
| 8,054,296 B2 | 11/2011 | Land et al. |
| 8,054,300 B2 | 11/2011 | Bernstein |
| 8,077,154 B2 | 12/2011 | Emig et al. |
| 8,090,497 B2 | 1/2012 | Ando |
| 8,253,425 B2 | 8/2012 | Reynolds et al. |
| 8,283,800 B2 | 10/2012 | Salter et al. |
| 8,330,385 B2 | 12/2012 | Salter et al. |
| 8,339,286 B2 | 12/2012 | Cordeiro |
| 8,386,027 B2 | 2/2013 | Chuang et al. |
| 8,454,181 B2 | 6/2013 | Salter et al. |
| 8,456,180 B2 | 6/2013 | Sitarski |
| 8,508,487 B2 | 8/2013 | Schwesig et al. |
| 8,517,383 B2 | 8/2013 | Wallace et al. |
| 8,537,107 B1 | 9/2013 | Li |
| 8,570,053 B1 | 10/2013 | Ryshtun et al. |
| 8,575,949 B2 | 11/2013 | Salter et al. |
| 8,659,414 B1 * | 2/2014 | Schuk ........................... 340/457 |
| 8,908,034 B2 * | 12/2014 | Bordonaro ................... 348/143 |
| 8,933,708 B2 | 1/2015 | Buttolo et al. |
| 8,981,265 B2 * | 3/2015 | Jiao et al. ...................... 219/507 |
| 2001/0019228 A1 | 9/2001 | Gremm |
| 2001/0028558 A1 | 10/2001 | Rapp et al. |
| 2002/0040266 A1 | 4/2002 | Edgar et al. |
| 2002/0084721 A1 | 7/2002 | Walczak |
| 2002/0093786 A1 | 7/2002 | Maser |
| 2002/0149376 A1 | 10/2002 | Haffner et al. |
| 2002/0167439 A1 | 11/2002 | Bloch et al. |
| 2002/0167704 A1 | 11/2002 | Kleinhans et al. |
| 2003/0002273 A1 | 1/2003 | Anderson, Jr. et al. |
| 2003/0101781 A1 | 6/2003 | Budzynski et al. |
| 2003/0122554 A1 * | 7/2003 | Karray et al. ................. 324/662 |
| 2003/0128116 A1 | 7/2003 | Ieda et al. |
| 2003/0189211 A1 * | 10/2003 | Dietz ............................. 257/79 |
| 2004/0056753 A1 | 3/2004 | Chiang et al. |
| 2004/0090195 A1 | 5/2004 | Motsenbocker |
| 2004/0145613 A1 | 7/2004 | Stavely et al. |
| 2004/0160072 A1 | 8/2004 | Carter et al. |
| 2004/0160234 A1 | 8/2004 | Denen et al. |
| 2004/0160713 A1 | 8/2004 | Wei |
| 2004/0197547 A1 | 10/2004 | Bristow et al. |
| 2004/0246239 A1 | 12/2004 | Knowles et al. |
| 2005/0012484 A1 | 1/2005 | Gifford et al. |
| 2005/0052429 A1 | 3/2005 | Philipp |
| 2005/0068045 A1 | 3/2005 | Inaba et al. |
| 2005/0068712 A1 | 3/2005 | Schulz et al. |
| 2005/0073425 A1 | 4/2005 | Snell et al. |
| 2005/0088417 A1 | 4/2005 | Mulligan |
| 2005/0092097 A1 | 5/2005 | Shank et al. |
| 2005/0110769 A1 | 5/2005 | DaCosta et al. |
| 2005/0137765 A1 | 6/2005 | Hein et al. |
| 2005/0242923 A1 | 11/2005 | Pearson et al. |
| 2005/0275567 A1 | 12/2005 | DePue et al. |
| 2006/0022682 A1 | 2/2006 | Nakamura et al. |
| 2006/0038793 A1 | 2/2006 | Philipp |
| 2006/0044800 A1 | 3/2006 | Reime |
| 2006/0055534 A1 | 3/2006 | Fergusson |
| 2006/0082545 A1 | 4/2006 | Choquet et al. |
| 2006/0170241 A1 | 8/2006 | Yamashita |
| 2006/0238518 A1 | 10/2006 | Westerman et al. |
| 2006/0238521 A1 | 10/2006 | Westerman et al. |
| 2006/0244733 A1 | 11/2006 | Geaghan |
| 2006/0250142 A1 | 11/2006 | Abe |
| 2006/0262549 A1 | 11/2006 | Schmidt et al. |
| 2006/0267953 A1 | 11/2006 | Peterson et al. |
| 2006/0279015 A1 | 12/2006 | Wang |
| 2006/0287474 A1 | 12/2006 | Crawford et al. |
| 2007/0008726 A1 | 1/2007 | Brown |
| 2007/0023265 A1 | 2/2007 | Ishikawa et al. |
| 2007/0051609 A1 | 3/2007 | Parkinson |
| 2007/0068730 A1 | 3/2007 | Yerdon et al. |
| 2007/0096565 A1 | 5/2007 | Breed et al. |
| 2007/0103431 A1 | 5/2007 | Tabatowski-Bush |
| 2007/0206668 A1 * | 9/2007 | Jin ................................. 375/224 |
| 2007/0226994 A1 | 10/2007 | Wollach et al. |
| 2007/0232779 A1 | 10/2007 | Moody et al. |
| 2007/0247429 A1 | 10/2007 | Westerman |
| 2007/0255468 A1 | 11/2007 | Strebel et al. |

(56) References Cited

U.S. PATENT DOCUMENTS

| | | |
|---|---|---|
| 2007/0257891 A1 | 11/2007 | Esenther et al. |
| 2007/0271072 A1 | 11/2007 | Kovacevich |
| 2007/0296709 A1 | 12/2007 | GuangHai |
| 2008/0012835 A1 | 1/2008 | Rimon et al. |
| 2008/0018604 A1 | 1/2008 | Paun et al. |
| 2008/0023715 A1 | 1/2008 | Choi |
| 2008/0030465 A1 | 2/2008 | Konet et al. |
| 2008/0074398 A1 | 3/2008 | Wright |
| 2008/0111714 A1 | 5/2008 | Kremin |
| 2008/0136792 A1 | 6/2008 | Peng et al. |
| 2008/0142352 A1 | 6/2008 | Wright |
| 2008/0143681 A1 | 6/2008 | XiaoPing |
| 2008/0150905 A1 | 6/2008 | Grivna et al. |
| 2008/0158146 A1 | 7/2008 | Westerman |
| 2008/0196945 A1 | 8/2008 | Konstas |
| 2008/0202912 A1 | 8/2008 | Boddie et al. |
| 2008/0231290 A1 | 9/2008 | Zhitomirsky |
| 2008/0238650 A1 | 10/2008 | Riihimaki et al. |
| 2008/0246723 A1* | 10/2008 | Baumbach ............... 345/156 |
| 2008/0257706 A1 | 10/2008 | Haag |
| 2008/0272623 A1 | 11/2008 | Kadzban et al. |
| 2009/0066659 A1 | 3/2009 | He et al. |
| 2009/0079699 A1 | 3/2009 | Sun |
| 2009/0108985 A1 | 4/2009 | Haag et al. |
| 2009/0115731 A1 | 5/2009 | Rak |
| 2009/0120697 A1 | 5/2009 | Wilner et al. |
| 2009/0135157 A1 | 5/2009 | Harley |
| 2009/0212849 A1 | 8/2009 | Reime |
| 2009/0225043 A1 | 9/2009 | Rosener |
| 2009/0235588 A1 | 9/2009 | Patterson et al. |
| 2009/0236210 A1 | 9/2009 | Clark et al. |
| 2009/0251435 A1 | 10/2009 | Westerman et al. |
| 2009/0256578 A1 | 10/2009 | Wuerstlein et al. |
| 2009/0256677 A1 | 10/2009 | Hein et al. |
| 2009/0273563 A1 | 11/2009 | Pryor |
| 2009/0295409 A1 | 12/2009 | Irkliy |
| 2009/0295556 A1 | 12/2009 | Inoue et al. |
| 2009/0309616 A1 | 12/2009 | Klinghult et al. |
| 2010/0001746 A1 | 1/2010 | Duchene et al. |
| 2010/0001974 A1 | 1/2010 | Su et al. |
| 2010/0007613 A1 | 1/2010 | Costa |
| 2010/0007620 A1 | 1/2010 | Hsieh et al. |
| 2010/0013777 A1 | 1/2010 | Baudisch et al. |
| 2010/0026654 A1 | 2/2010 | Suddreth |
| 2010/0039392 A1 | 2/2010 | Pratt et al. |
| 2010/0066391 A1 | 3/2010 | Hirasaka et al. |
| 2010/0090712 A1 | 4/2010 | Vandermeijden |
| 2010/0090966 A1 | 4/2010 | Gregorio |
| 2010/0102830 A1 | 4/2010 | Curtis et al. |
| 2010/0103139 A1 | 4/2010 | Soo et al. |
| 2010/0110037 A1 | 5/2010 | Huang et al. |
| 2010/0117970 A1 | 5/2010 | Burstrom et al. |
| 2010/0125393 A1 | 5/2010 | Jarvinen et al. |
| 2010/0156814 A1 | 6/2010 | Weber et al. |
| 2010/0177057 A1 | 7/2010 | Flint et al. |
| 2010/0188356 A1 | 7/2010 | Vu et al. |
| 2010/0188364 A1 | 7/2010 | Lin et al. |
| 2010/0194692 A1 | 8/2010 | Orr et al. |
| 2010/0207907 A1 | 8/2010 | Tanabe et al. |
| 2010/0212819 A1 | 8/2010 | Salter et al. |
| 2010/0214253 A1 | 8/2010 | Wu et al. |
| 2010/0219935 A1 | 9/2010 | Bingle et al. |
| 2010/0241431 A1 | 9/2010 | Weng et al. |
| 2010/0241983 A1 | 9/2010 | Walline et al. |
| 2010/0245286 A1 | 9/2010 | Parker |
| 2010/0250071 A1 | 9/2010 | Pala et al. |
| 2010/0277431 A1 | 11/2010 | Klinghult |
| 2010/0280983 A1 | 11/2010 | Cho et al. |
| 2010/0286867 A1 | 11/2010 | Bergholz et al. |
| 2010/0289754 A1 | 11/2010 | Sleeman et al. |
| 2010/0289759 A1 | 11/2010 | Fisher et al. |
| 2010/0296303 A1 | 11/2010 | Sarioglu et al. |
| 2010/0302200 A1 | 12/2010 | Netherton et al. |
| 2010/0315267 A1 | 12/2010 | Chung et al. |
| 2010/0321214 A1 | 12/2010 | Wang et al. |
| 2010/0321321 A1 | 12/2010 | Shenfield et al. |
| 2010/0321335 A1 | 12/2010 | Lim et al. |
| 2010/0328261 A1 | 12/2010 | Woolley et al. |
| 2010/0328262 A1 | 12/2010 | Huang et al. |
| 2011/0001707 A1 | 1/2011 | Faubert et al. |
| 2011/0001722 A1 | 1/2011 | Newman et al. |
| 2011/0007021 A1 | 1/2011 | Bernstein et al. |
| 2011/0007023 A1 | 1/2011 | Abrahamsson et al. |
| 2011/0012623 A1 | 1/2011 | Gastel et al. |
| 2011/0018744 A1 | 1/2011 | Philipp |
| 2011/0018817 A1 | 1/2011 | Kryze et al. |
| 2011/0022393 A1 | 1/2011 | Waller et al. |
| 2011/0031983 A1 | 2/2011 | David et al. |
| 2011/0034219 A1 | 2/2011 | Filson et al. |
| 2011/0037725 A1 | 2/2011 | Pryor |
| 2011/0037735 A1 | 2/2011 | Land et al. |
| 2011/0039602 A1 | 2/2011 | McNamara et al. |
| 2011/0041409 A1 | 2/2011 | Newman et al. |
| 2011/0043481 A1 | 2/2011 | Bruwer |
| 2011/0050251 A1 | 3/2011 | Franke et al. |
| 2011/0050587 A1 | 3/2011 | Natanzon et al. |
| 2011/0050618 A1 | 3/2011 | Murphy et al. |
| 2011/0050620 A1 | 3/2011 | Hristov |
| 2011/0055753 A1 | 3/2011 | Horodezky et al. |
| 2011/0057899 A1 | 3/2011 | Sleeman et al. |
| 2011/0062969 A1 | 3/2011 | Hargreaves et al. |
| 2011/0063425 A1 | 3/2011 | Tieman |
| 2011/0074573 A1 | 3/2011 | Seshadri |
| 2011/0080365 A1 | 4/2011 | Westerman |
| 2011/0080366 A1 | 4/2011 | Bolender |
| 2011/0080376 A1 | 4/2011 | Kuo et al. |
| 2011/0082616 A1 | 4/2011 | Small et al. |
| 2011/0083110 A1 | 4/2011 | Griffin et al. |
| 2011/0095997 A1 | 4/2011 | Philipp |
| 2011/0115732 A1 | 5/2011 | Coni et al. |
| 2011/0115742 A1 | 5/2011 | Sobel et al. |
| 2011/0134047 A1 | 6/2011 | Wigdor et al. |
| 2011/0134054 A1 | 6/2011 | Woo et al. |
| 2011/0141006 A1 | 6/2011 | Rabu |
| 2011/0141041 A1 | 6/2011 | Parkinson et al. |
| 2011/0148803 A1 | 6/2011 | Xu |
| 2011/0157037 A1 | 6/2011 | Shamir et al. |
| 2011/0157079 A1 | 6/2011 | Wu et al. |
| 2011/0157080 A1 | 6/2011 | Ciesla et al. |
| 2011/0157089 A1 | 6/2011 | Rainisto |
| 2011/0161001 A1 | 6/2011 | Fink |
| 2011/0163764 A1 | 7/2011 | Shank et al. |
| 2011/0169758 A1 | 7/2011 | Aono |
| 2011/0187492 A1 | 8/2011 | Newman et al. |
| 2011/0210755 A1 | 9/2011 | Ogawa |
| 2011/0279276 A1 | 11/2011 | Newham |
| 2011/0279409 A1 | 11/2011 | Salaverry et al. |
| 2011/0309912 A1 | 12/2011 | Muller |
| 2012/0007821 A1 | 1/2012 | Zaliva |
| 2012/0037485 A1* | 2/2012 | Sitarski ............... 200/600 |
| 2012/0043973 A1 | 2/2012 | Kremin |
| 2012/0043976 A1 | 2/2012 | Bokma et al. |
| 2012/0055557 A1 | 3/2012 | Belz et al. |
| 2012/0062247 A1 | 3/2012 | Chang |
| 2012/0062498 A1 | 3/2012 | Weaver et al. |
| 2012/0068956 A1 | 3/2012 | Jira et al. |
| 2012/0104790 A1 | 5/2012 | Plavetich et al. |
| 2012/0154324 A1 | 6/2012 | Wright et al. |
| 2012/0217147 A1 | 8/2012 | Porter et al. |
| 2012/0312676 A1 | 12/2012 | Salter et al. |
| 2012/0313648 A1 | 12/2012 | Salter et al. |
| 2012/0313767 A1 | 12/2012 | Sitarski |
| 2012/0319992 A1 | 12/2012 | Lee |
| 2013/0024169 A1 | 1/2013 | Veerasamy |
| 2013/0033356 A1 | 2/2013 | Sitarski et al. |
| 2013/0036529 A1 | 2/2013 | Salter et al. |
| 2013/0076121 A1 | 3/2013 | Salter et al. |
| 2013/0093500 A1 | 4/2013 | Bruwer |
| 2013/0106436 A1 | 5/2013 | Brunet et al. |
| 2013/0113397 A1 | 5/2013 | Salter et al. |
| 2013/0113544 A1 | 5/2013 | Salter et al. |
| 2013/0126325 A1 | 5/2013 | Curtis et al. |
| 2013/0170013 A1 | 7/2013 | Tonar et al. |
| 2013/0270896 A1 | 10/2013 | Buttolo et al. |

(56) References Cited

U.S. PATENT DOCUMENTS

| | | |
|---|---|---|
| 2013/0270899 A1 | 10/2013 | Buttolo et al. |
| 2013/0271157 A1 | 10/2013 | Buttolo et al. |
| 2013/0271159 A1 | 10/2013 | Santos et al. |
| 2013/0271182 A1 | 10/2013 | Buttolo et al. |
| 2013/0271202 A1 | 10/2013 | Buttolo et al. |
| 2013/0271203 A1 | 10/2013 | Salter et al. |
| 2013/0271204 A1 | 10/2013 | Salter et al. |
| 2013/0291439 A1 | 11/2013 | Wuerstlein et al. |
| 2013/0321065 A1 | 12/2013 | Salter et al. |
| 2013/0328616 A1 | 12/2013 | Buttolo et al. |
| 2014/0002405 A1 | 1/2014 | Salter et al. |
| 2014/0145733 A1 | 5/2014 | Buttolo et al. |
| 2014/0252879 A1 | 9/2014 | Dassanayake et al. |
| 2014/0306723 A1 | 10/2014 | Salter et al. |
| 2014/0306724 A1 | 10/2014 | Dassanayake et al. |
| 2015/0077227 A1 | 3/2015 | Salter et al. |

FOREIGN PATENT DOCUMENTS

| | | |
|---|---|---|
| EP | 1327860 | 7/2003 |
| EP | 1562293 | 8/2005 |
| EP | 2133777 | 10/2011 |
| EP | 2133777 B1 | 10/2011 |
| GB | 2071338 | 9/1981 |
| GB | 2158737 | 11/1985 |
| GB | 2279750 | 1/1995 |
| GB | 2409578 | 6/2005 |
| GB | 2418741 | 4/2006 |
| JP | 61188515 | 8/1986 |
| JP | 4065038 | 3/1992 |
| JP | 04082416 | 3/1992 |
| JP | 07315880 | 12/1995 |
| JP | 08138446 | 5/1996 |
| JP | 11065764 | 3/1999 |
| JP | 11110131 | 4/1999 |
| JP | 11260133 | 9/1999 |
| JP | 11316553 | 11/1999 |
| JP | 2000047178 | 2/2000 |
| JP | 2000075293 | 3/2000 |
| JP | 2001013868 | 1/2001 |
| JP | 2006007764 | 1/2006 |
| JP | 2007027034 | 2/2007 |
| JP | 2008033701 | 2/2008 |
| JP | 2010139362 | 6/2010 |
| JP | 2010165618 | 7/2010 |
| JP | 2010218422 | 9/2010 |
| JP | 2010239587 | 10/2010 |
| JP | 2010287148 | 12/2010 |
| JP | 2011014280 | 1/2011 |
| KR | 20040110463 | 12/2004 |
| KR | 1020090127544 A | 12/2009 |
| KR | 20100114768 | 10/2010 |
| KR | 10-1258376 * | 4/2013 |
| WO | 9636960 | 11/1996 |
| WO | 9963394 | 12/1999 |
| WO | 2006093398 | 9/2006 |
| WO | 2007022027 | 2/2007 |
| WO | 2008121760 | 10/2008 |
| WO | 2009054592 | 4/2009 |
| WO | 2010111362 | 9/2010 |
| WO | 2012032318 | 3/2012 |
| WO | 2012032318 A1 | 3/2012 |
| WO | 2012169106 | 12/2012 |
| WO | 2012169106 A1 | 12/2012 |

OTHER PUBLICATIONS

U.S. Appl. No. 14/552,809, filed Nov. 25, 2014, entitled "Proximity Switch Based Door Latch Release," (14 pages of specification and 4 pages of drawings) and Official Filing Receipt (3 pages).

U.S. Appl. No. 14/314,328, filed Jun. 25, 2014, entitled "Proximity Switch Assembly Having Pliable Surface and Depression," (43 pages of specification and 24 pages of drawings) and Official Filing Receipt (3 pages).

U.S. Appl. No. 14/314,364, filed Jun. 25, 2014, entitled "Proximity Switch Assembly Having Groove Between Adjacent Proximity Sensors," (43 pages of specification and 24 pages of drawings) and Official Filing Receipt (3 pages).

Van Ess, Dave et al., "Capacitive Touch Switches for Automotive Applications," 7 pages, Published in Automotive DesignLine, www.automotiedesignline.com, Feb. 2006.

"Introduction to Touch Solutions, White Paper, Rivision 1.0 A," Densitron Corporation, 14 pages, Aug. 21, 2007.

Kliffken, Marksu G. et al., "Obstacle Detection for Power Operated Window-Lift and Sunroof Actuation Systems," Paper No. 2001-01-0466, 1 page, © 2011 SAE International, Published Mar. 5, 2001.

NXP Capacitive Sensors, 1 page, www.nxp.com, copyrighted 2006-2010, NXP Semiconductors.

"Moisture Immunity in QuickSense Studio," AN552, Rev. 0.1 Oct. 2010, 8 pages, Silicon Laboratories, Inc., © 2010.

"CLEVIOS P Formulation Guide," 12 pages, www.clevios.com, Heraeus Clevios GmbH, no date provided.

"Charge-Transfer Sensing-Based Touch Controls Facilitate Creative Interfaces," www.ferret.com.au, 2 pages, Jan. 18, 2006.

Kiosk Peripherals, "Touch Screen," www.bitsbytesintegrators.com/kiosk-peripherals.html, 10 pages, no date provided.

JVC KD-AVX777 Detachable Front-Panel with Integrated 5.4" Touch-Screen Monitor, 6 pages, www.crutchfield.com, no date provided.

Ergonomic Palm Buttons, Pepperl+Fuchs, www.wolfautomation.com, 6 pages, no date provided.

"Orgacon EL-P3000, Screen printing Ink Series 3000," 2 pages, AGFA, last updated in Feb. 2006.

"Touch Sensors Design Guide" by ATMEL, 10620 D-AT42-04/09, Revised Apr. 2009, 72 pages, Copyrighted 2008-2009 Atmel Corporation.

U.S. Appl. No. 13/609,390, filed Sep. 11, 2012, entitled "Proximity Switch Based Door Latch Release," (14 pages of specification and 4 pages of drawings) and Official Filing Receipt (3 pages).

U.S. Appl. No. 13/665,253, filed Oct. 31, 2012, entitled Proximity Switch Assembly Having Round Layer, (15 pages of specification and 7 pages of drawings) and Official Filing Receipt (3 pages).

U.S. Appl. No. 13/799,413, filed Mar. 13, 2013, entitled "Proximity Interface Development System Having Replicator and Method," (29 pages of specification and 20 pages of drawings) and Official Filing Receipt (3 pages).

U.S. Appl. No. 13/799,478, filed Mar. 13, 2013, entitled "Proximity Interface Development System Having Analyzer and Method," (29 pages of specification and 20 pages of drawings) and Official Filing Receipt (3 pages).

U.S. Appl. No. 14/168,614, filed Jan. 30, 2014, entitled "Proximity Switch Assembly and Activation Method Having Virtual Button Mode," (30 pages of specification and 15 pages of drawings) and Official Filing Receipt (3 pages).

U.S. Appl. No. 14/635,140, filed Mar. 2, 2015, entitled "Proximity Switch Having Wrong Touch Adaptive Learning and Method," (20 pages of specification and 7 pages of drawings) and Official Filing Receipt (3 pages).

U.S. Appl. No. 14/661,325, filed Mar. 18, 2015, entitled "Proximity Switch Assembly Having Haptic Feedback and Method," (31 pages of specification and 15 pages of drawings) and Official Filing Receipt (3 pages).

U.S. Appl. No. 14/689,324, filed Apr. 17, 2015, entitled "Proximity Switch Assembly With Signal Drift Rejection and Method," (35 pages of specification and 17 pages of drawings) and Official Filing Receipt (3 pages).

* cited by examiner

PROXIMITY SWITCH ASSEMBLY HAVING DYNAMIC TUNED THRESHOLD

FIELD OF THE INVENTION

The present invention generally relates to switches, and more particularly relates to proximity switches having an enhanced determination of switch activation.

BACKGROUND OF THE INVENTION

Automotive vehicles are typically equipped with various user actuatable switches, such as switches for operating devices including powered windows, headlights, windshield wipers, moonroofs or sunroofs, interior lighting, radio and infotainment devices, and various other devices. Generally, these types of switches need to be actuated by a user in order to activate or deactivate a device or perform some type of control function. Proximity switches, such as capacitive switches, employ one or more proximity sensors to generate a sense activation field and sense changes to the activation field indicative of user actuation of the switch, typically caused by a user's finger in close proximity or contact with the sensor. Capacitive switches are typically configured to detect user actuation of the switch based on comparison of the sense activation field to a threshold.

Switch assemblies often employ a plurality of capacitive switches in close proximity to one another and generally require that a user select a single desired capacitive switch to perform the intended operation. In some applications, such as use in an automobile, the driver of the vehicle has limited ability to view the switches due to driver distraction. Additionally, proper selection of a desired switch is generally more difficult when the vehicle is experiencing dynamic motion such as vibrations caused by driving on a rough road. In such applications, it is desirable to allow the user to select a switch or explore the switch assembly for a specific button while avoiding a premature or inadvertent determination of switch activation. Thus, it is desirable to discriminate whether the user intends to activate a switch, or is simply exploring for a specific switch button while focusing on a higher priority task, such as driving, or has no intent to activate a switch. Accordingly, it is desirable to provide for a proximity switch arrangement which enhances the use of proximity switches by a person, such as a driver of a vehicle, particularly when enhanced dynamic motion of the vehicle is experienced.

SUMMARY OF THE INVENTION

According to one aspect of the present invention, the method of activating a proximity switch is provided. The method of activating the proximity switch includes the step of sensing a signal associated with a proximity sensor and sensing a dynamic parameter. The method also includes the step of tuning a threshold value based on the sensed dynamic parameter. The method further includes the step of activating the switch based on the signal and the threshold value.

According to another aspect of the present invention, a proximity switch assembly is provided. The proximity switch assembly includes a plurality of proximity switches each providing a sense activation field. The proximity switch also includes control circuitry. The control circuitry processes the activation field to sense a signal associated with a proximity sensor, senses a dynamic parameter, tunes a threshold value based on the sensed dynamic parameter, and activates the switch based on the signal and the threshold value.

These and other aspects, objects, and features of the present invention will be understood and appreciated by those skilled in the art upon studying the following specification, claims, and appended drawings.

DETAILED DESCRIPTION OF THE PREFERRED EMBODIMENTS

As required, detailed embodiments of the present invention are disclosed herein; however, it is to be understood that the disclosed embodiments are merely exemplary of the invention that may be embodied in various and alternative forms. The figures are not necessarily to a detailed design; some schematics may be exaggerated or minimized to show function overview. Therefore, specific structural and functional details disclosed herein are not to be interpreted as limiting, but merely as a representative basis for teaching one skilled in the art to variously employ the present invention.

Figure 1:
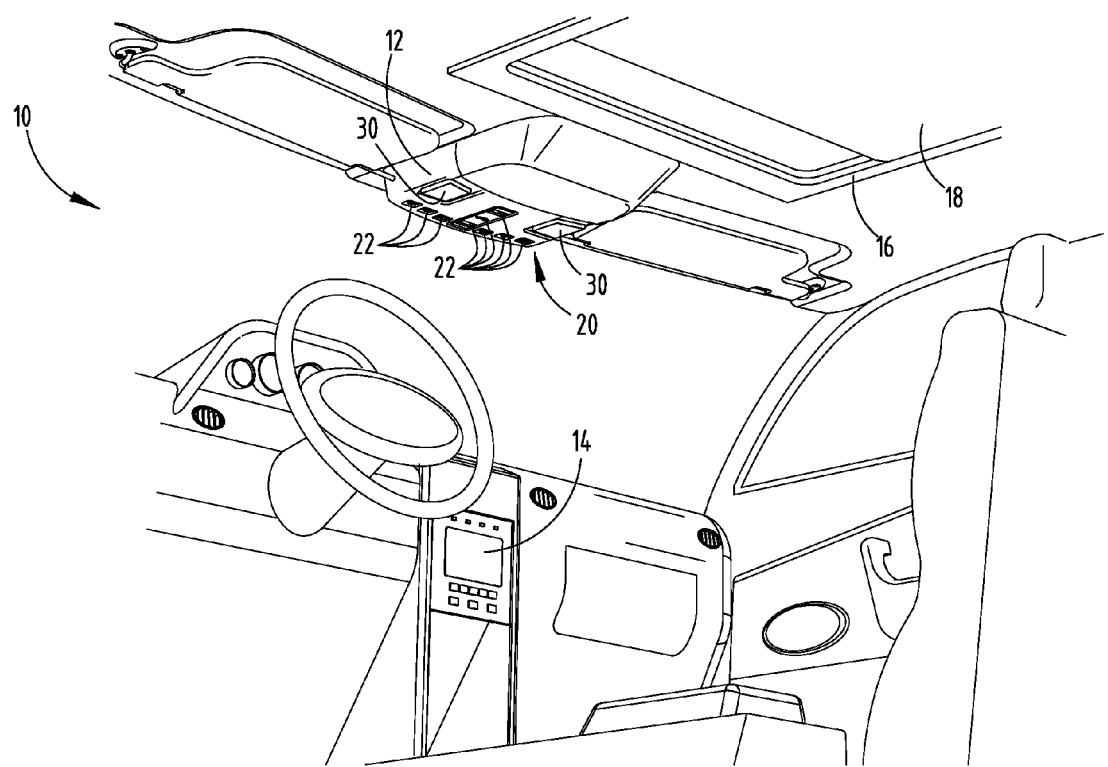
FIG. 1 is a perspective view of a passenger compartment of an automotive vehicle having an overhead console employing a proximity switch assembly, according to one embodiment.
Figure 2:
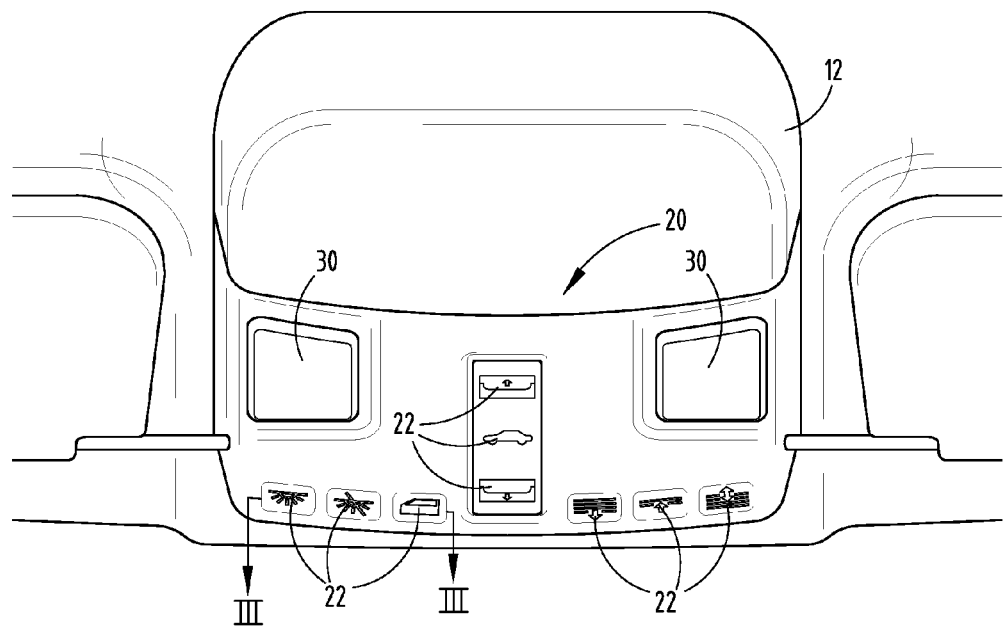
FIG. 2 is an enlarged view of the overhead console and proximity switch assembly shown in FIG. 1.

Referring to FIGS. 1 and 2, the interior of an automotive vehicle 10 is generally illustrated having a passenger compartment and a switch assembly 20 employing a plurality of proximity switches 22, according to one embodiment. The vehicle 10 generally includes an overhead console 12 assembled to the headliner on the underside of the roof or ceiling at the top of the vehicle passenger compartment, generally above the front passenger seating area. The switch assembly 20 has a plurality of proximity switches 22 arranged close to one another in the overhead console 12, according to one embodiment. The various proximity switches 22 may control any of a number of vehicle devices and functions, such as controlling movement of a sunroof or moonroof 16, controlling movement of a moonroof shade 18, controlling activation of one or more lighting devices such as interior map/reading and dome lights 30, and various other devices and functions. However, it should be appreciated that the proximity switches 22 may be located elsewhere on the vehicle 10, such as in the dash panel, on other consoles such as a center console, on a door, integrated into a touch screen display 14 for a radio or infotainment system such as a navigation and/or audio display, or located elsewhere onboard the vehicle 10 according to various vehicle applications.

The proximity switches 22 are shown and described herein as capacitive switches, according to one embodiment. Each proximity switch 22 includes at least one proximity sensor that provides a sense activation field to sense contact or close proximity (e.g., within one millimeter) of a user in relation to the one or more proximity sensors, such as a swiping motion by a user's finger. Thus, the sense activation field of each proximity switch 22 is a capacitive field in the exemplary embodiment and the user's finger has electrical conductivity and dielectric properties that cause a change or disturbance in the sense activation field as should be evident to those skilled in the art. However, it should also be appreciated by those skilled in the art that additional or alternative types of proximity sensors can be used, such as, but not limited to, inductive sensors, optical sensors, temperatures sensors, resistive sensors, the like, or a combination thereof. Exemplary proximity sensors are described in the Apr. 9, 2009, ATMEL® Touch Sensors Design Guide, 10620 D-AT42-04/09, the entire reference hereby being incorporated herein by reference.

The proximity switches 22 shown in FIGS. 1 and 2 each provide control of a vehicle component or device or provide a designated control function. One or more of the proximity switches 22 may be dedicated to controlling movement of a sunroof or moonroof 16 so as to cause the moonroof 16 to move in an open or closed direction, tilt the moonroof, or stop movement of the moonroof based upon a control algorithm. One or more other proximity switches 22 may be dedicated to controlling movement of a moonroof shade 18 between open and closed positions. Each of the moonroof 16 and shade 18 may be actuated by an electric motor in response to actuation of the corresponding proximity switch 22. Other proximity switches 22 may be dedicated to controlling other devices, such as turning an interior map/reading light 30 on, turning an interior map/reading light 30 off, turning a dome lamp on or off, unlocking a trunk, opening a rear hatch, or defeating a door light switch. Additional controls via the proximity switches 22 may include actuating door power windows up and down. Various other vehicle controls may be controlled by way of the proximity switches 22 described herein. Some of the proximity switches may be designated as critical switches, such as those for controlling movement of the moonroof or shade to the closed position, while other switches may be designated as non-critical switch.

Figure 3:
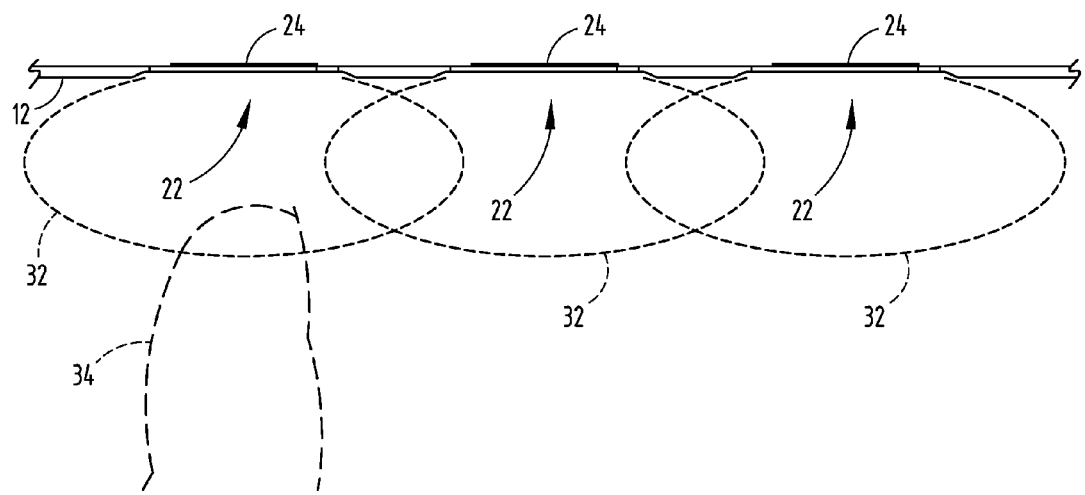
FIG. 3 is an enlarged cross-sectional view taken through line III-III in FIG. 2 showing an array of proximity switches in relation to a user's finger.

Referring to FIG. 3, a portion of the proximity switch assembly 20 is illustrated having an array of three serially arranged proximity switches 22 in close relation to one another in relation to a user's finger 34 during use of the switch assembly 20. Each proximity switch 22 includes one or more proximity sensors 24 for generating a sense activation field. The proximity sensors 24 may be formed on the top surface polymeric overhead console which is opposite the bottom side contact surface. The bottom side of the overhead console 12 has a contact surface for each switch 24. Each switch 22 may also have a lighting device located on the top surface for backlighting each switch 22.

Figure 4:
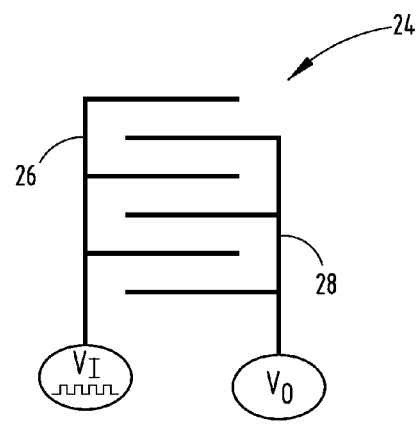
FIG. 4 is a schematic diagram of a capacitive sensor employed in each of the capacitive switches shown in FIG. 3.

According to one embodiment, each of the proximity sensors 24 may be formed by printing conductive ink onto the top surface of the polymeric overhead console 12. One example of a printed ink proximity sensor 24 is shown in FIG. 4 generally having a drive electrode 26 and a receive electrode 28 each having interdigitated fingers for generating a capacitive field 32. It should be appreciated that each of the proximity sensors 24 may be otherwise formed such as by assembling a preformed conductive circuit trace onto a substrate according to other embodiments. The drive electrode 26 receives square wave drive pulses applied at voltage $V_I$. The receive electrode 28 has an output for generating an output voltage $V_O$. It should be appreciated that the electrodes 26 and 28 may be arranged in various other configurations for generating the capacitive field as the activation field 32.

In the embodiment shown and described herein, the drive electrode 26 of each proximity sensor 24 is applied with voltage input $V_I$ as square wave pulses having a charge pulse cycle sufficient to charge the receive electrode 28 to a desired voltage. The receive electrode 28 thereby serve as a measurement electrode. In the embodiment shown, adjacent sense activation fields 32 generated by adjacent proximity switches 22 overlap slightly, however, overlap may not exist according to other embodiments. When a user or operator, such as the user's finger 34, enters an activation field 32, the proximity switch assembly 20 detects the disturbance caused by the finger 34 to the activation field 32 and determines whether the disturbance is sufficient to activate the corresponding proximity switch 22. The disturbance of the activation field 32 is detected by processing the charge pulse signal associated with the corresponding signal channel. When the user's finger 34 contacts two activation fields 32, the proximity switch assembly 20 detects the disturbance of both contacted activation fields 32 via separate signal channels. Each proximity switch 22 has its own dedicated signal channel generating charge pulse counts which is processed as discussed herein.

Figure 5:
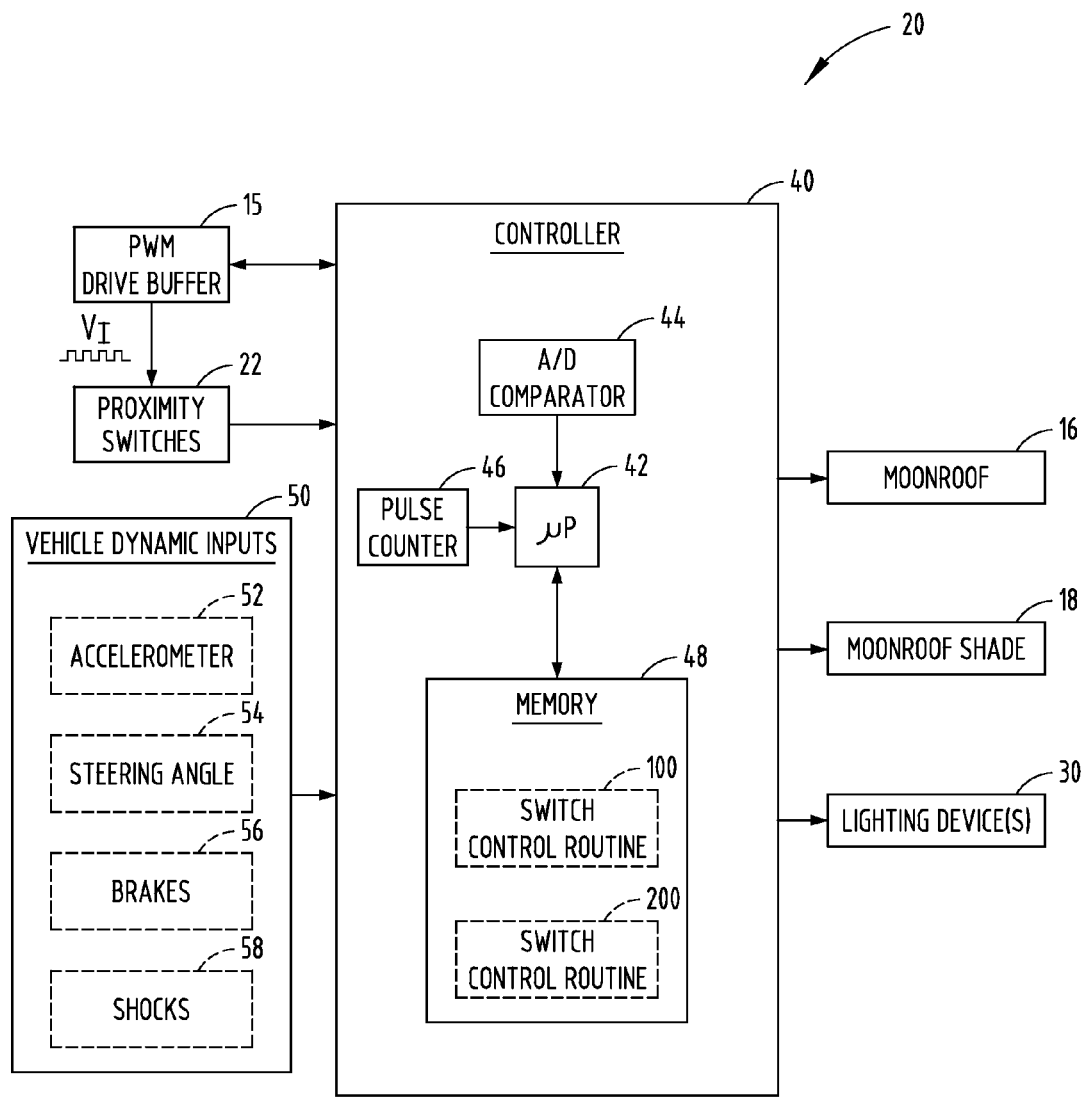
FIG. 5 is a block diagram illustrating the proximity switch assembly, according to one embodiment.

Referring to FIG. 5, the proximity switch assembly 20 is illustrated according to one embodiment. A plurality of proximity switches 22 are shown providing inputs to a controller 40, such as a microcontroller. The plurality of proximity switches each provide a sense activation field. The controller 40 may include control circuitry, such as a microprocessor 42 and memory 48. The control circuitry may include sense control circuitry processing the activation field signal of each switch 22 to sense user activation of the corresponding switch by comparing the activation field signal to one or more thresholds pursuant to one or more control routines. The control circuitry further senses a dynamic parameter, such as a vehicle dynamic parameter associated with the vehicle, and tunes a threshold value based on the sensed vehicle dynamic parameter. The control circuitry further activates a switch based on the signal and the threshold value. It should be appreciated that other analog and/or digital control circuitry may be employed to process each activation field signal, tune the threshold value, determine user activation, and initiate an action. The controller 40 may employ a QMatrix acquisition method available by ATMEL®, according to one embodiment. The ATMEL acquisition method employs a WINDOWS® host C/C++ compiler and debugger WinAVR to simplify development and testing the utility Hawkeye that allows monitoring in real-time the internal state of critical variables in the software as well as collecting logs of data for post-processing.

The controller 40 provides an output signal to one or more devices that are configured to perform dedicated actions responsive to detected activation of a proximity switch. For example, the one or more devices may include a moonroof 16 having a motor to move the moonroof panel between open and closed and tilt positions, a moonroof shade 18 that moves between open and closed positions, and lighting devices 30 that may be turned on and off. Other devices may be controlled such as a radio for performing on and off functions, volume control, scanning, and other types of devices for performing other dedicated functions. One of the proximity switches 22 may be dedicated to actuating the moonroof closed, another proximity switch 22 may be dedicated to actuating the moonroof open, and a further switch 22 may be dedicated to actuating the moonroof to a tilt position, all of which would cause a motor to move the moonroof to a desired position. The moonroof shade 18 may be opened in response to one proximity switch 22 and may be closed responsive to another proximity switch 22.

The proximity switch assembly 20 is further shown including one or more vehicle dynamic inputs 50 that are provided as inputs to controller 40. The vehicle dynamic inputs 50 may include one or more of vehicle acceleration 52, vehicle steering angle 54, vehicle braking 56, and vehicle shocks 58, according to various embodiments. Each of the vehicle dynamic inputs 50 provides a parameter indicative of the dynamic state or motion of the vehicle. The vehicle dynamic parameters may indicate a rough road condition, such as the vehicle driving off-road or on a rough, e.g., bumpy, roadway. When the vehicle is on a rough road, the stability and precision of a user's finger to activate a switch may be unstable. A rough road condition may be determined based on acceleration signal indicative of vertical acceleration and/or the shock signal indicative of the up and down motion of the vehicle. The vehicle dynamic inputs may also indicate other dynamic motions of the vehicle, such as sudden decelerations, sudden accelerations, and quick turning of the vehicle during which the stability and precision of the user's finger to activate a switch may be unstable or difficult. When vehicle dynamic motion for such events occur, the control circuitry may tune a threshold value that is used to determine activation of the proximity switches to provide for an enhanced determination of switch activation. It should be appreciated that the vehicle dynamic inputs may include acceleration obtained from an accelerometer or other dedicated or shared device, a steering angle from the vehicle steering wheel or road wheel position, a brake signal from the vehicle braking system, and a shock-related parameter obtained from one or more vehicle shocks. It should be appreciated that other vehicle dynamic parameters may be employed by the proximity switch assembly 20 according to other embodiments.

The controller 40 is further shown having an analog to digital (A/D) comparator 44 coupled to the microprocessor 42. The A/D comparator 44 receives the voltage output $V_O$ from each of the proximity switches 22, converts the analog signal to a digital signal, and provides the digital signal to the microprocessor 42. Additionally, controller 40 includes a pulse counter 46 coupled to the microprocessor 42. The pulse counter 46 counts the charge signal pulses that are applied to each drive electrode of each proximity sensor, performs a count of the pulses needed to charge the capacitor until the voltage output $V_O$ reaches a predetermined voltage, and provides the count to the microprocessor 42. The pulse count is indicative of the change in capacitance of the corresponding capacitive sensor. The controller 40 is further shown communicating with a pulse width modulated drive buffer 15. The controller 40 provides a pulse width modulated signal to the pulse width modulated drive buffer 15 to generate a square wave pulse train $V_I$ which is applied to each drive electrode of each proximity sensor/switch 22. The controller 40 processes one or more control routines, shown including switch control routines 100 and 200 stored in memory to monitor the various signals, tune the threshold(s), and make a determination as to activation of one of the proximity switches.

The switch control routines 100 and 200 process the various proximity switches and performs a method of activating a proximity switch which includes tuning one or more threshold values associated with the switch based on one or more sensed dynamic parameters. The method includes the steps of sensing a signal associated with a proximity sensor, and sensing a dynamic parameter. The method also includes the step of tuning a threshold value based on the sensed dynamic parameter. The method further includes the step of activating the switch based on the signal and the threshold value. The step of sensing the dynamic parameter may include sensing acceleration of a vehicle, according to one embodiment. According to various vehicle embodiments, the step of sensing vehicle dynamic parameter may include sensing a signal generated by one or more of vehicle braking, vehicle shocks and vehicle steering wheel. One of more of the dynamic parameters may be indicative of a rough road condition or other dynamic motion experienced on the vehicle. The method may also determine a substantially stable state of the signal and activate the switch further based on the presence of a substantially stable state. The substantially stable state may be detected if the signal is at a substantially constant value for a time period, such as 100 milliseconds, according to one embodiment. The time period for a substantially stable state determination and the range in signal amplitude for determining a stable range may be adjusted as part of the tuning of the tuning based on the vehicle dynamics parameter. The substantially stable state may be based on a stable range for a stable time period. Further, the method may determine activation of the signal based on a signal ratio of a first signal associated with a first switch compared to a second signal associated with a second neighboring switch, and may activate the switch based on the signal ratio.

Referring to FIGS. 6A-8B, the change in sensor charge pulse counts shown as Δ sensor count for a signal associated with a proximity switch 22 shown in FIGS. 1-5, is illustrated according to various embodiments. The change in sensor charge pulse count (Δ sensor count) is the difference between an initialized referenced count value without any finger or other object present in the activation field and the corresponding sensor reading. In this example, the user's finger enters the activation field 32 associated with the proximity switch 22 as the user's finger moves across the switch. The signal shown by solid line 60 is the change (Δ) in sensor charge pulse count associated with the corresponding capacitive sensor 24. In the disclosed embodiment, the proximity sensors 24 are capacitive sensors. When a user's finger is in contact with or close proximity of the sensor 24, the finger alters the capacitance measured at the corresponding sensor 24. The capacitance is in parallel to the untouched sensor pad parasitic capacitance, and as such, measures as an offset. The user or operator induced capacitance is proportional to the user's finger or other body part dielectric constant, the surface exposed to the capacitive pad, and is inversely proportional to the distance of the user's limb to the switch button. According to one embodiment, each sensor is excited with a train of voltage pulses via pulse width modulation (PWM) electronics until the sensor is charged up to a set voltage potential. Such an acquisition method charges the receive electrode to a known voltage potential. The cycle is repeated until the voltage across the measurement capacitor reaches a predetermined voltage. Placing a user's finger on the touch surface of the switch 22 introduces external capacitance that increases the amount of charge transferred each cycle, thereby reducing the total number of cycles required for the measurement capacitance to reach the predetermined voltage. The user's finger causes the change in sensor charge pulse count to increase since this value is based on the initialized reference count minus the sensor reading.

The proximity switch assembly 20 is able to recognize the user's hand motion when the hand, particularly a finger, is in close proximity to the proximity switch 22, to discriminate whether the intent of the user is to activate a switch 22, explore for a specific switch button while focusing on higher priority tasks, such as driving, or is the result of a task such as adjusting the rearview mirror that has nothing to do with actuation of a proximity switch 22. The proximity switch assembly 20 may operate in an exploration or hunting mode which enables the user to explore the touch sensor keypads or buttons of the switch assembly 20 by passing or sliding a finger in close proximity to the switches without triggering an activation of a switch until the user's intent is determined. The proximity switch assembly 20 monitors the amplitude of the signal generated in response to the activation field for each switch, monitors one or more dynamic inputs, adjusts a threshold based on the dynamic input(s), compares the signal to the threshold and detects activation of the switch based on the signal exceeding the threshold. As such, exploration of the proximity assembly is allowed, while activation is detected even while experiencing dynamic motion, such that users are free to explore the switch interface pad with their fingers without inadvertently triggering an event, the interface response time is fast, activation happens based on rate of change in the signal(s), and inadvertent activation of the switch is prevented or reduced. It should be appreciated that a signal associated with each switch is processed by the proximity switch assembly 20 to determine activation of the corresponding switch.

Figure 6A:
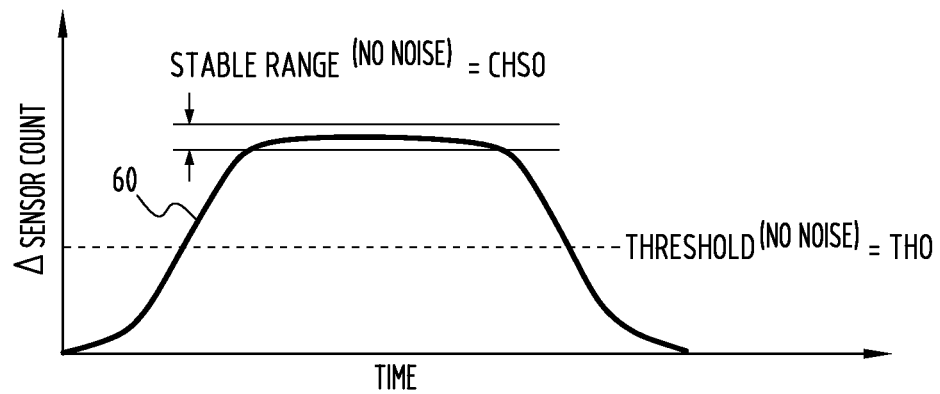
FIG. 6A is a graph illustrating a signal associated with a proximity switch during activation on a normal smooth road.
Figure 6B:
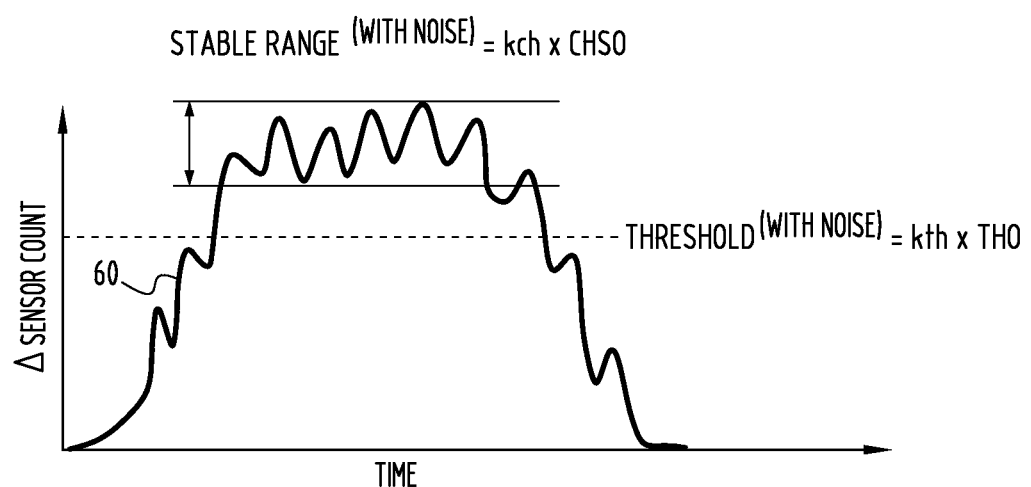
FIG. 6B is a graph illustrating a signal associated with a proximity switch during activation for a rough road condition based on a tuned threshold and stable range, according to one embodiment.

As shown in FIGS. 6A and 6B, as the user's finger 34 slides across the contact surface of a switch, the finger 34 enters the activation field associated with the corresponding sensor 24 which causes disruption of the capacitance, thereby resulting in a Δ sensor count increase as shown by signal 60 having an activation motion profile. The proximity switch assembly monitors the signal 60 and determines whether the operator intends to press a touch pad or button for activation of the current switch. The system and method monitors when the signal 60 with little or no noise exceeds a threshold shown in FIG. 6A labeled THO. The system and method also determines whether the signal 60 has a substantially stable value within a stable range identified as CHSO. Thus, when there is little or no noise induced on the signal 60 due to vehicle dynamic conditions, the system and method will determine activation of the proximity switch when the Δ sensor count exceeds the threshold THO and is substantially stable based on CHSO, for some minimum time period.

Referring particularly to FIG. 6B, the system and method detects vehicle dynamic motion such as a rough road condition by monitoring one or more vehicle dynamic parameters indicative of a rough road condition. As shown, the signal 60 has noise caused by a rough road condition shown by the undulations. When a vehicle dynamic parameter is sensed, such as the accelerometer signal N, the system and method tunes the threshold value based on the vehicle dynamic parameter. According to one embodiment, the threshold is increased from threshold THO to TH=kth×THO whenever signal due to vehicle dynamic motion such as a rough road condition is over a threshold. In addition, the stable range CHSO is increased to an increased range identified as CHS=kch×CHSO when noise due to vehicle dynamic motion such as a rough road condition is present. Thus, no noise is detected due to sufficient acceleration or other dynamic motion, the threshold is increased and the stable range is increased so as to prevent inadvertent actuations of the proximity switch when driving in a rough road condition or other dynamic motion scenario.

Figure 7A:
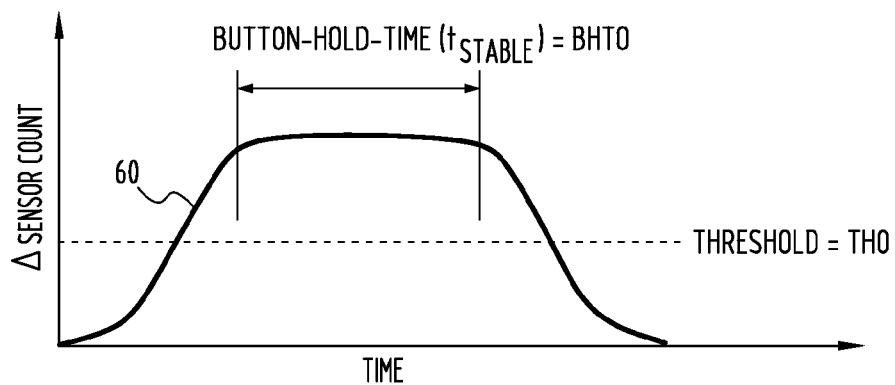
FIG. 7A is a graph illustrating a signal associated with a proximity switch during activation on a normal smooth road condition.
Figure 7B:
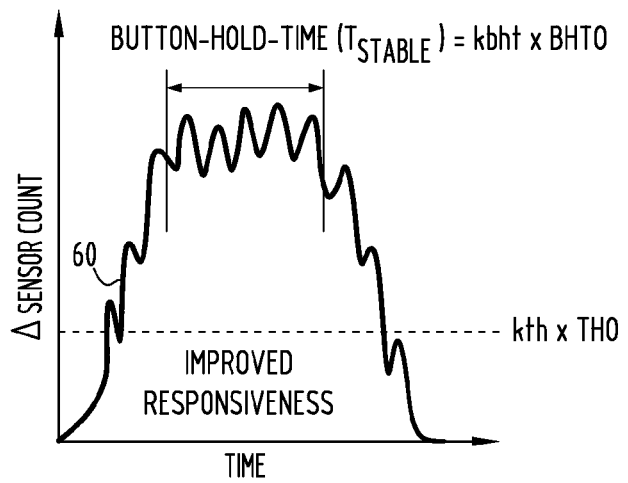
FIG. 7B is a graph illustrating a signal associated with a non-critical proximity switch during activation for a rough road condition based on a tuned threshold and stable time, according to another embodiment.
Figure 7C:
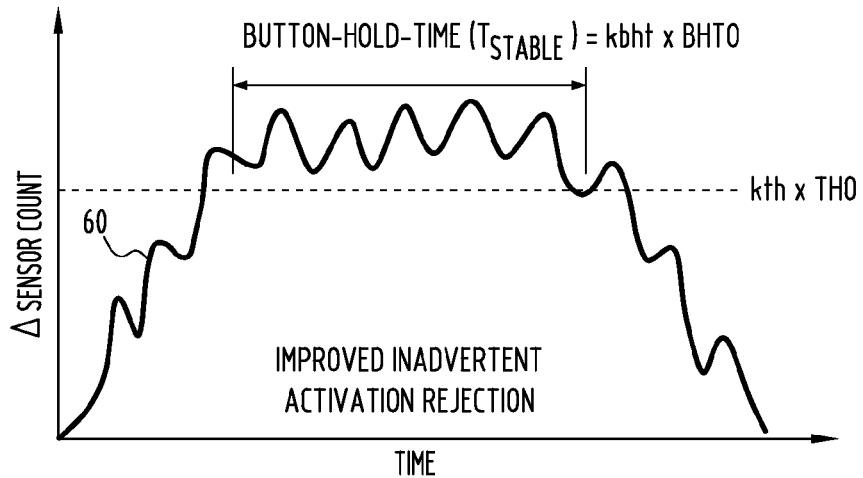
FIG. 7C is a graph illustrating a signal associated with a critical proximity switch during activation for a rough road condition.

Referring to FIGS. 7A-7C, a signal 60 associated with a proximity switch is illustrated with little or no noise when little or no vehicle dynamic is sensed in FIG. 7A, and when vehicle dynamic motion due to a rough road condition is detected for a non-critical switch in FIG. 7B, and when vehicle dynamic motion due to a rough road condition is detected for a critical switch in FIG. 7C. When little or no noise due to dynamic motion is present, the signal 60 is compared to threshold THO to determine whether or not the proximity switch is activated as shown in FIG. 7A. For a non-critical switch, the threshold is decreased to TH=kth×THO, and the stable button hold time BHTO is decreased to BHT=kbht×BHTO, when dynamic motion is sensed. When dynamic motion is sensed for a critical switch, the threshold is increased, TH>THO, and the stable time period for a button hold is increased BHT>THO. As such, when the signal 60 reaches the elevated threshold TH for a sufficient stable time period BHT, activation of the proximity switch is determined. It should be appreciated that a critical switch may be a switch that has a critical function and is less desirable of experiencing an inadvertent actuation. An example of a critical switch is a switch for opening and closing a moonroof or window.

Figure 8A:
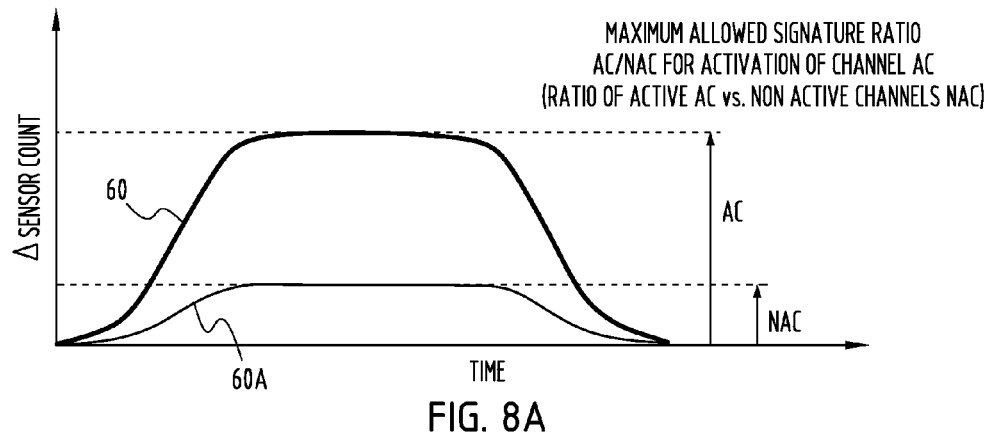
FIG. 8A is a graph illustrating signals associated with two proximity switches on a normal smooth road.
Figure 8B:
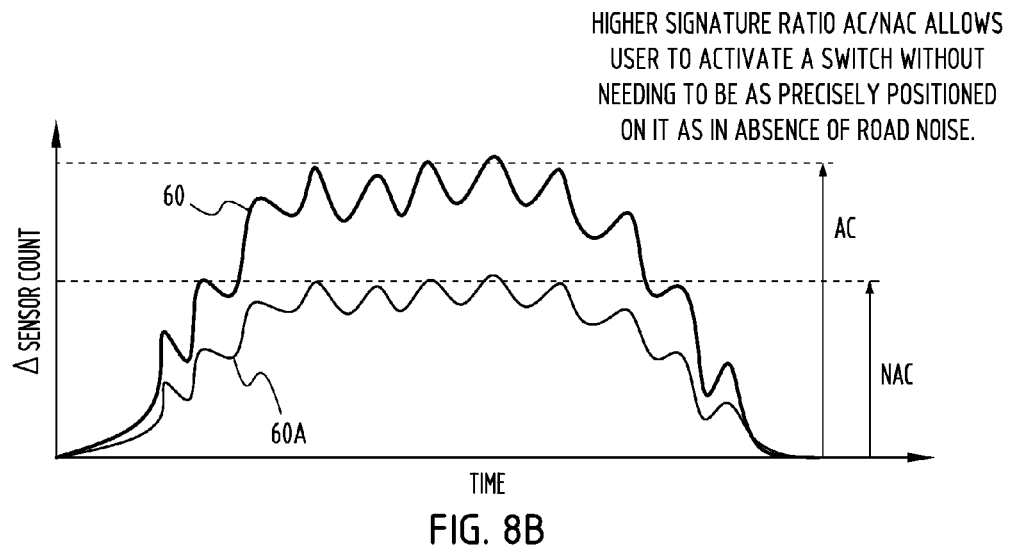
FIG. 8B is a graph illustrating signals associated with two proximity switches during activation for a rough road condition based on a signature ratio, according to a further embodiment.

Referring to FIGS. 8A and 8B, a signal 60 associated with a proximity threshold value tuning based on a signature ratio of the current switch in comparison to a neighbor switch is provided, according to a further embodiment. In this embodiment, the proximity switch for signal 60 has an amplitude AC compared to an amplitude NAC for a neighboring switch indicated by signal 60A. The maximum allowed signature ratio AC divided by NAC is used by to determine activation of the channel associated with channel 60. For a non-critical switch, the signal ratio AC divided by NAC may be increased and used as a threshold to allow a user to activate a switch without needing to be as precisely positioned on it as in the absence of dynamic motion as shown in FIG. 8B. Thus, the tuning may involve changing the signal ratio AC divided by NAC when signal noise is detected indicative of dynamic motion of the vehicle.

Figure 9:
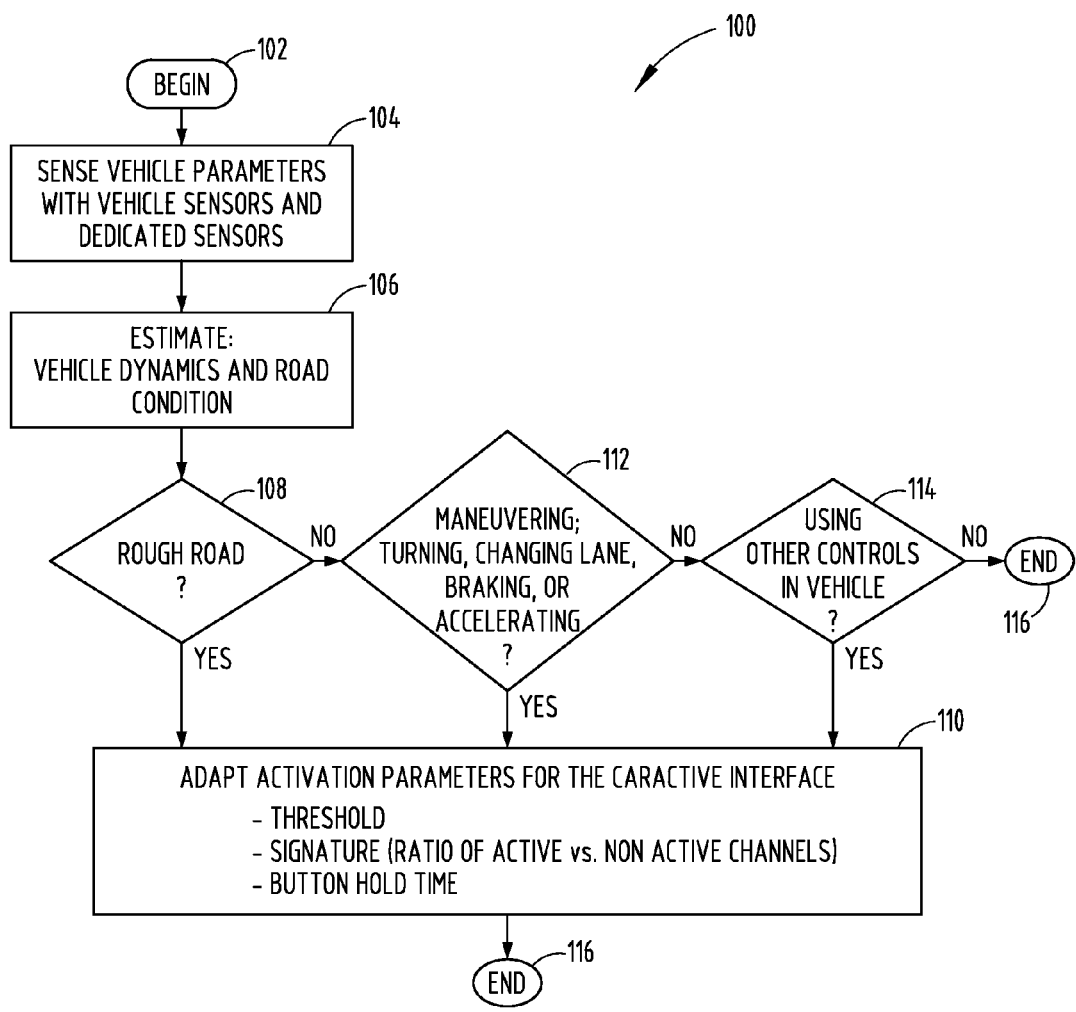
FIG. 9 is a block/flow diagram illustrating a general method of tuning a proximity switch assembly based on one or more dynamic parameters.

Referring to FIG. 9, a routine 100 is illustrated for activating a proximity switch which includes tuning a threshold value based on vehicle dynamics, according to one embodiment. Routine 100 begins at step 102 and proceeds to step 104 to sense one or more vehicle dynamic parameters with vehicle sensors and dedicated sensors. Method 100 includes step 106 of estimating vehicle dynamics and road condition which may include estimating a rough road condition or vehicle maneuvers such as sudden accelerations, sudden decelerations, sudden turning, etc. Method 100 then proceeds to decision step 108 to determine if a rough road condition is present and, if so, adapts activation parameters for the capacitive interface at step 110. The adaptive activation parameters may include tuning a threshold, tuning a signature which is a ratio of active versus non-active channels associated with neighboring switches, and tuning a button hold time or range for stability. If no rough road condition is detected in step 108, routine 100 proceeds to step 112 to determine if maneuvering, turning, changing lanes, braking or acceleration is detected and, if so, adapts the activation parameters in step 110. Otherwise, method 100 proceeds to step 114 to determine if other dynamic related controls in the vehicle are being used and, if so, adapts the activation parameters in step 110. Otherwise, routine 100 ends at step 116. It should be appreciated that once the adapted activation parameters are adjusted or tuned, the routine may determine activation of a proximity switch based upon the tuned parameters.

Figure 10:
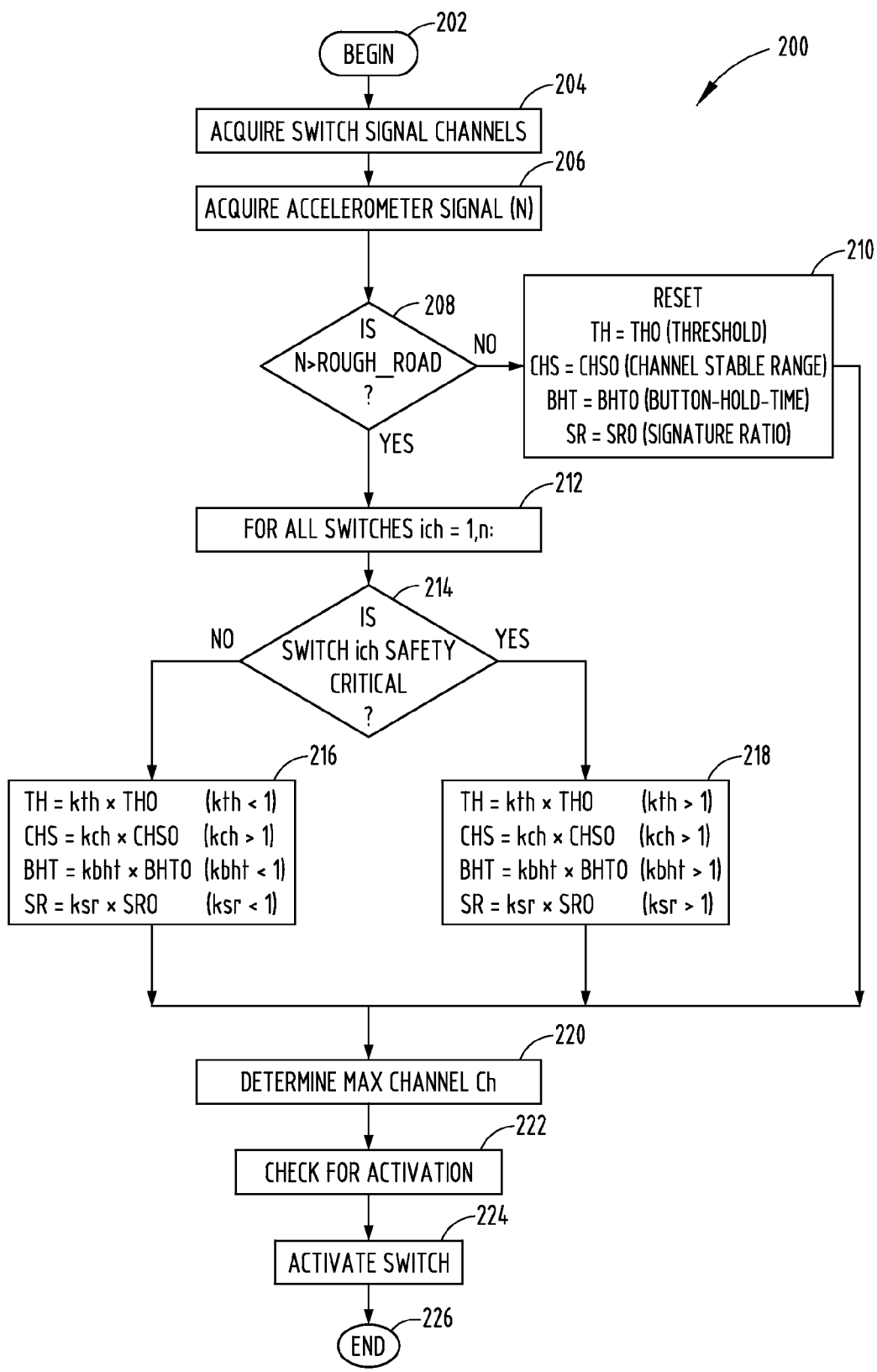
FIG. 10 is a flow diagram illustrating a more specific method of tuning the proximity switch assembly and activating a switch, according to one embodiment.

Referring to FIG. 10, a routine 200 is illustrated for activating a proximity switch and tuning a threshold value based on a vehicle dynamic parameter. Routine 200 begins at step 202 and proceeds step 204 to acquire switch signal channels and then to step 206 to acquire one or more acceleration signals. In this example, acceleration is employed to determine dynamic motion of the vehicle. Next, routine 200 proceeds to decision step 208 to determine if the acceleration signal is greater than a rough road threshold and, if not, resets values of threshold (TH), channel stable range (CHS), button-hold-time (BHT) and signature ratio (SR). If a rough road condition is determined, routine 200 proceeds to step 212 to set ICH for all switches equal to one. Next, at decision step 214, routine 200 determines if the switch ICH safety is critical. If the switch ICH safety is not critical, routine 200 proceeds to step 216 to apply a multiplication factor K (kth, kch, kbht, or ksr) to each of the threshold (TH), channel stable range (CHS), button-hold-time (BHT) and signature ratio (SR). The multiplication factor K is less than one for each of the threshold, button-hold-time, and signature ratio, and is greater than one for the button-hold-time.

If the switch ICH safety is critical, routine 200 proceeds to step 218 to apply a multiplication factor to each of the threshold, channel stable range, button-hold-time and signature ratio. For each of these parameters, the multiplication factor K is greater than one. Accordingly, for critical and non-critical switches, different parameters may be employed so as to tune the parameters for use in determining activation of a proximity switch. Method 200 includes step 220 of determining the max channel CH and step 222 of checking for activation and activating the switch at step 224 before ending at step 226.

Accordingly, the proximity switch assembly and method advantageously determines activation of the proximity switches based on a differential signal caused by a differential elevation change feature. The system and method advantageously allows for a user to explore the proximity switch pads which can be particularly useful in an automotive application where driver distraction can be avoided.

It is to be understood that variations and modifications can be made on the aforementioned structure without departing from the concepts of the present invention, and further it is to be understood that such concepts are intended to be covered by the following claims unless these claims by their language expressly state otherwise.

We claim:

1. A method of activating a proximity switch comprising:
sensing a signal associated with a proximity sensor;
sensing a dynamic motion parameter indicative of dynamic motion of the proximity switch;
tuning a threshold value of the switch based on the sensed dynamic motion parameter to allow improved switch activation during the sensed dynamic motion; and
activating the switch based on the signal and the tuned threshold value.

2. The method of claim 1, wherein the step of tuning the threshold value comprises changing a threshold value that is compared to the sensed signal.

3. The method of claim 2, wherein the step of tuning comprises increasing the threshold value when sufficient dynamic motion is detected.

4. The method of claim 2 further comprising the step of detecting a stable signal and activating the switch further based on the detected stable signal.

5. The method of claim 4, wherein the step of tuning the threshold value further comprises changing a time period that the signal is required to be at a substantially constant value, wherein the stable signal is compared to the time period to determine activation of the switch.

6. The method of claim 4, wherein the step of tuning the threshold value further comprises changing a signal range that the signal is required to be within for a time period to be stable, wherein the stable signal is compared to the signal range to determine activation of the switch.

7. A method of activating a proximity switch comprising:
sensing a signal associated with a proximity sensor;
sensing a dynamic parameter;
tuning a threshold value based on the sensed dynamic parameter comprising determining a ratio of a first signal associated with a first switch to a second signal associated with a second switch and changing the threshold value based on the ratio; and
activating the switch based on the signal and the threshold value.

8. The method of claim 1, wherein the step of sensing the dynamic motion parameter comprises sensing acceleration of a vehicle.

9. The method of claim 1, wherein the step of sensing the dynamic motion parameter comprises sensing a signal generated by one of vehicle braking, vehicle shocks, and vehicle steering wheel.

10. The method of claim 1, wherein the switch is located on a vehicle and the sensed dynamic motion parameter is dynamic motion of the vehicle.

11. A proximity switch assembly comprising:
a plurality of proximity switches each providing a sense activation field; and
control circuitry processing the activation field to sense a signal associated with a proximity sensor, sensing a dynamic motion parameter indicative of dynamic motion of the switch assembly, tuning a threshold value of the switch based on the sensed dynamic motion parameter to allow improved switch activation during the sensed dynamic motion, and activating the switch based on the signal and the tuned threshold value.

12. The proximity switch assembly of claim 11, wherein the step of tuning the threshold value comprises changing a threshold value that is compared to the sensed signal.

13. The proximity switch assembly of claim 12, wherein the step of tuning comprises increasing the threshold value when sufficient dynamic motion is detected.

14. The method of claim 12 further comprising the step of detecting a stable signal and activating the switch further based on the detected stable signal.

15. The proximity switch assembly of claim 14, wherein the step of tuning the threshold value further comprises changing a time period that the signal is required to be at a substantially constant value, wherein the stable signal is compared to the time period to determine activation of the switch.

16. The proximity switch assembly of claim 14, wherein the step of tuning the threshold value further comprises changing a signal range that the signal is required to be within for a time period to be stable, wherein the stable signal is compared to the signal range to determine activation of the switch.

17. The proximity switch assembly of claim 11, wherein the step of tuning the threshold value comprises determining a ratio of a first signal associated with a first switch to a second signal associated with a second switch and to changing the threshold value based on the ratio.

18. The proximity switch assembly of claim 11, wherein the step of sensing the dynamic motion parameter comprises sensing acceleration of a vehicle.

19. The proximity switch assembly of claim 11, wherein the step of sensing the vehicle dynamic motion parameter comprises sensing a signal generated by one of vehicle braking, vehicle shocks, and vehicle steering wheel.

20. The proximity switch assembly of claim 11, wherein the switch assembly is located on a vehicle and the sensed dynamic motion parameter is indicative of motion of the vehicle.

* * * * *